(12) United States Patent
Yashima (10) Patent No.: US 8,669,537 B2
(45) Date of Patent: Mar. 11, 2014

(54) CHARGED PARTICLE BEAM WRITING APPARATUS AND METHOD

(75) Inventor: Jun Yashima, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 660 days.

(21) Appl. No.: 12/560,802

(22) Filed: Sep. 16, 2009

(65) Prior Publication Data

US 2010/0072390 A1   Mar. 25, 2010

(30) Foreign Application Priority Data

Sep. 19, 2008 (JP) .................................. 2008-240340

(51) Int. Cl.
*G21K 1/08* (2006.01)

(52) U.S. Cl.
USPC .................. 250/492.1; 250/396 R; 250/492.2; 250/492.21; 250/492.22; 250/492.23; 716/50; 716/51; 716/53; 716/104; 716/139

(58) Field of Classification Search
USPC .................. 250/396 R, 492.1, 492.2, 492.21, 250/492.22, 492.23, 492.3; 716/50, 51, 53, 716/104, 126, 132, 139
See application file for complete search history.

(56) References Cited

U.S. PATENT DOCUMENTS

| 5,189,306 A | * | 2/1993 | Frei | 250/492.2 |
| 5,523,580 A | * | 6/1996 | Davis | 250/505.1 |
| 6,015,975 A | * | 1/2000 | Kawakami et al. | 250/492.22 |
| 6,194,102 B1 | * | 2/2001 | Nakasuji et al. | 430/5 |
| 6,258,511 B1 | * | 7/2001 | Okino | 430/296 |
| 6,307,209 B1 | * | 10/2001 | Nakasuji et al. | 250/492.22 |
| 6,313,476 B1 | * | 11/2001 | Shimizu et al. | 250/492.22 |
| 6,333,138 B1 | * | 12/2001 | Higashikawa et al. | 430/296 |
| 6,774,380 B2 | * | 8/2004 | Abe | 250/492.23 |
| 8,122,390 B2 | * | 2/2012 | Yashima et al. | 716/53 |
| 2002/0028398 A1 | * | 3/2002 | Ogino | 430/30 |
| 2004/0011966 A1 | * | 1/2004 | Sasaki et al. | 250/492.1 |
| 2004/0079896 A1 | * | 4/2004 | Scaman | 250/491.1 |
| 2006/0060800 A1 | * | 3/2006 | Abe | 250/492.23 |
| 2008/0067423 A1 | * | 3/2008 | Kimura et al. | 250/492.1 |
| 2008/0067426 A1 | * | 3/2008 | Kimura et al. | 250/492.2 |
| 2009/0134343 A1 | * | 5/2009 | Inoue | 250/492.22 |

FOREIGN PATENT DOCUMENTS

| JP | 2008-117820 | 5/2008 | |
| JP | 2008117820 A | * 5/2008 | ............ H01L 21/027 |
| JP | 2008-182073 | 8/2008 | |

OTHER PUBLICATIONS

U.S. Appl. No. 13/235,432, filed Sep. 18, 2011, Nakayamada, et al.
U.S. Appl. No. 13/288,530, filed Nov. 3, 2011, Yashima.
Office Action issued in Japanese Application No. 2008-240340 filed Sep. 19, 2008 (w/English translation).
U.S. Appl. No. 13/765,140, filed Feb. 12, 2013, Kato, et al.

* cited by examiner

*Primary Examiner* — Michael Logie
(74) *Attorney, Agent, or Firm* — Oblon, Spivak, McClelland, Maier & Neustadt, L.L.P.

(57) ABSTRACT

A charged particle beam writing apparatus and a charged particle beam writing method capable of shortening the time necessary to generate shot data and improving writing throughput. A graphic pattern defined in write data is divided into graphics represented in shot units. The divided graphics are temporarily stored in a memory and are distributed to their corresponding subfield areas while developing position information defined in a state of being compressed to write data. When each pattern is written by multi-pass writing, graphics divided at a first pass are used for distribution to subfield areas after a second pass.

6 Claims, 13 Drawing Sheets

PRIOR ART

CHARGED PARTICLE BEAM WRITING APPARATUS AND METHOD

BACKGROUND OF THE INVENTION

1. Field of the Invention

The present invention relates to a charged particle beam writing apparatus and a charged particle beam writing method.

2. Background Art

With high integration of a semiconductor device, a circuit pattern of the semiconductor device has been miniaturized. In order to form a micro circuit pattern in the semiconductor device, a high-precision original image pattern (i.e., reticle or mask) is required. It is known that an electron beam writing apparatus having excellent resolution is used to manufacture the original image pattern.

In this type of electron beam writing apparatus, shot data is generated from write data in which the shape and position of each graphic pattern are defined. Main deflection data and sub deflection data are generated by a deflection controller in such a manner that each pattern contained in the shot data is written. The respective deflection data are DA-converted by a DAC amplifier (hereinafter abbreviated as "amp"). The so DA-converted signals are amplified and applied to a main deflector and a sub deflector, thereby writing each pattern onto a sample (refer to, for example, a patent document 1 (JP-A-2008-182073)).

A conventional shot data generating method will be explained with reference to FIG. 13.

Figure 13:
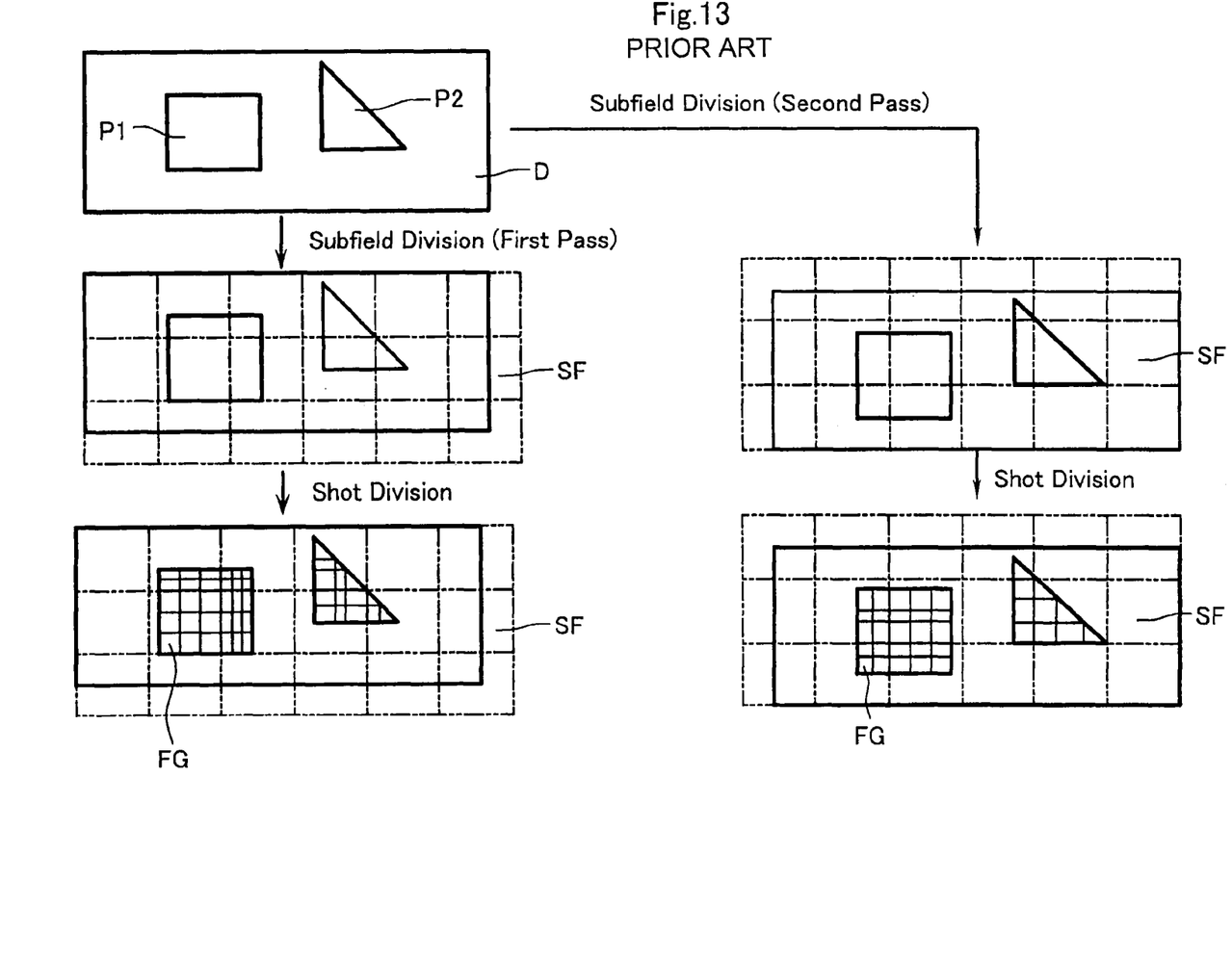
FIG. 13 is a conceptual diagram of explaining of a conventional shot data generating method.

As shown in FIG. 13, the shapes and positions of graphic patterns P1 and P2 are defined in write data D. In the conventional method, the graphic patterns P1 and P2 defined in the write data D are divided into a plurality of subfield areas SF. Next, they are divided into graphics FG expressed in shot units within the respective subfield areas SF.

Meanwhile, it is known that writing accuracy where a graphic is shot to the center of each subfield area SF and writing accuracy where a graphic is shot to the periphery of the subfield area SF, differ from each other. Multi-pass writing has been performed to enhance the writing accuracy. The multi-pass writing is a method for overlaying graphics written in plural independent passes on one another to write a target pattern.

As the multi-pass writing, there are known a method for overlaying graphics written with each subfield area being shifted, on each other, a method for overlaying graphics written with each stripe area (see FIG. 2) being shifted, on each other, and a method for overlaying graphics written with both areas being shifted, on each other.

FIG. 13 shows an example for generating shot data in two passes with subfield areas being shifted. In the example, subfield area division corresponding to the second pass is performed so as to differ from subfield area division corresponding to the first pass.

In the conventional method, however, graphics FG subsequent to the subfield area divisions differ from one another at the first and second passes. Since shot division is performed on the graphics divided into the subfield areas, it is necessary to perform the shot division for every pass. Thus, since the shot division must be done by the number of passes, time is taken to generate shot data and writing throughput is hence degraded.

Attention is paid to the rectangular graphic pattern P1 in the example illustrated in FIG. 13. The graphic pattern is shot-divided into 6×5=30 at the first pass, whereas the graphic pattern is shot-divided into 5×5=25 at the second pass. A problem arises in that when the number of shots differs for every pass in this way, a shot dividing method grows complicated. Further, a problem arises in that the number of shots increases depending on how to perform subfield division.

In a normal electron beam writing apparatus, the estimation of the number of shots is performed as a pre-process prior to the generation of shot data, and writing time is estimated from the result of its estimation. Since the conventional shot division is based on the graphics subsequent to the subfield area division and grows very complicated as mentioned above, a huge amount of time is taken for arithmetic processing. Therefore, only a simple method can be adopted as the method for estimating the number of shots as the pre-process. As a result, a problem arises in that the shot dividing method at the pre-process stage and the shot dividing method at the shot data generation stage differ and the accuracy of estimation of the number of shots corresponding to the pre-process is degraded.

SUMMARY OF THE INVENTION

The present invention has been made in view of the above problems. Namely, an object of the present invention is to provide a charged particle beam writing apparatus and a charged particle beam writing method capable of shortening the time necessary to generate shot data and improving writing throughput.

Other objects and advantages of the present invention will become apparent from the following description.

According to one aspect of the present invention, a charged particle beam writing apparatus for deflecting a charged particle beam by a main deflector and a sub deflector to write a pattern onto a sample, comprises a shot data generator for generating shot data from write data in which the shape and position of each graphic pattern are defined, and a deflection controller for generating deflection data for controlling the main deflector and the sub deflector from the shot data. The shot data generator comprises shot dividing means for dividing the graphic pattern defined in the write data into graphics expressed in shot units, and means for distributing the respective graphics divided by the shot dividing means to subfield areas capable of being deflected by the main deflector.

According to another aspect of the present invention, in a charged particle beam writing method for writing each pattern onto a sample using a charged particle beam deflected by a main deflector and a sub deflector, shot data is generated from write data in which the shape and position of each graphic pattern are defined. Deflection data is generated for controlling the main deflector and the sub deflector from the shot data. The shot data generating step includes a shot dividing step for dividing the graphic pattern defined in the write data into a plurality of graphics expressed in shot units, and a distributing step for distributing the divided graphics to their corresponding subfield areas capable of being deflected by the main deflector.

DETAILED DESCRIPTION OF THE EMBODIMENTS

Figure 1:
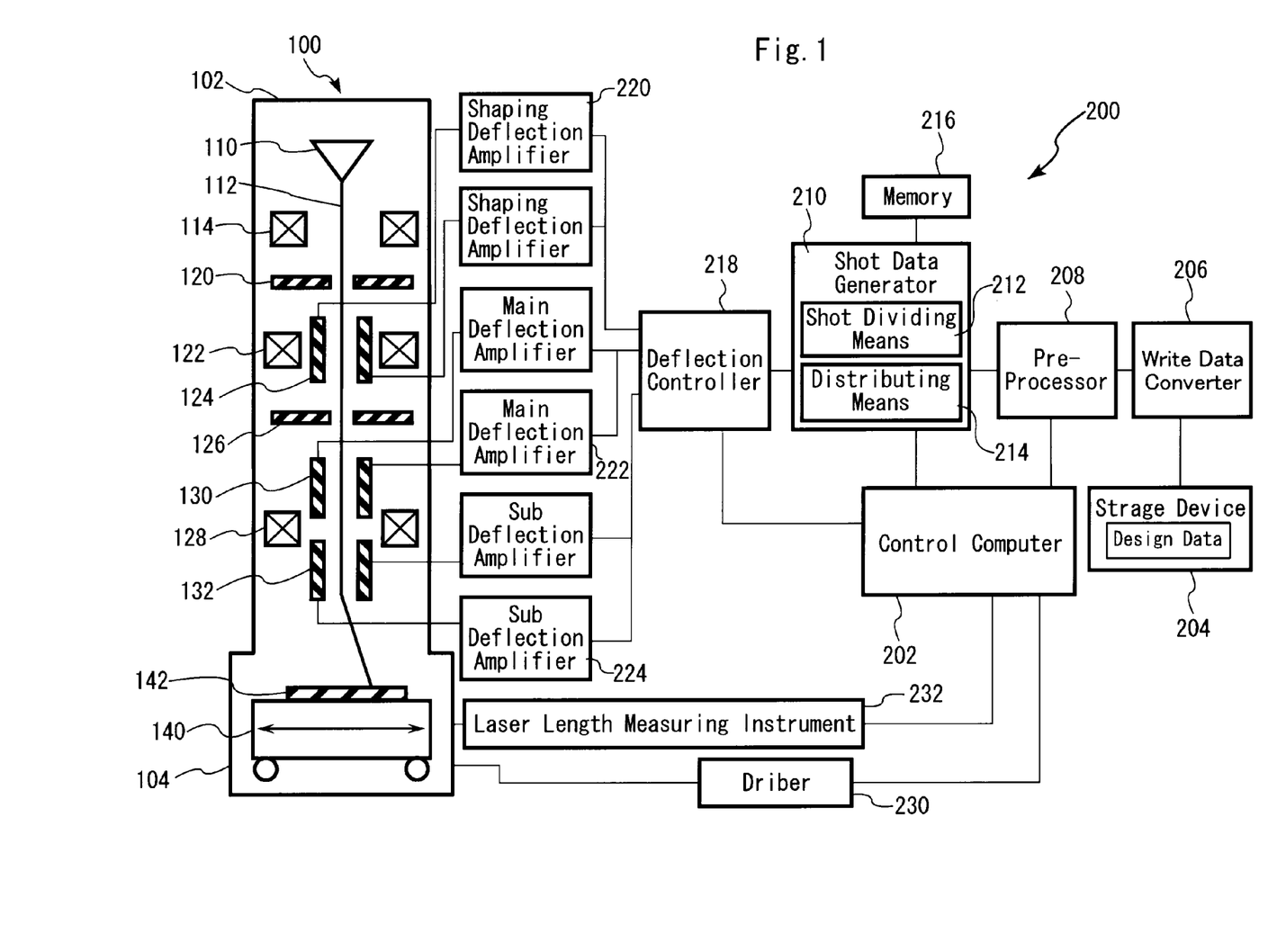
FIG. 1 is a conceptual diagram showing a configuration of an electron beam writing apparatus according to a first embodiment of the present invention.

FIG. 1 is a conceptual diagram showing a configuration of an electron beam writing apparatus according to a first embodiment of the present invention. The electron beam writing apparatus shown in FIG. 1 is equipped with a writing section 100, which includes an electronic lens barrel 102. An illuminating lens 114 for applying an electron beam (electron beam accelerated at 50 kV, for example) 112 emitted from an electron gun 110 to a first shaping aperture 120 is disposed within the electronic lens barrel 102.

The electron beam 112 is formed so as to assume a rectangle in its sectional shape by being penetrated through the first shaping aperture 120 having a rectangular opening. The so-shaped electron beam 112 is projected onto a second shaping aperture 126 by a projection lens 122. A molding or shaping deflector 124 is disposed concentrically with the electronic lens barrel 102 between the second shaping aperture 126 and the first shaping aperture 120. Since the degree of overlaying of a first shaping aperture image on an opening of the second shaping aperture 126 changes under control of the shaping deflector 124, the shape and size of the electron beam 112 can be controlled.

A focal point of the electron beam 112 transmitted through the second shaping aperture 126 is focused on the surface of a sample 142 lying within a writing chamber 104 by an objective lens 128. The sample 142 is placed on an XY stage 140 continuously moved in an X direction (horizontal direction as viewed in the figure) and a Y direction (depth direction as viewed in the figure). The XY stage 140 is moved by a driver 230 and the amount of movement of the XY stage 140 is measured by a laser length measuring instrument 232, so that its position can be recognized.

The sample 142 is, for example, a reticle or a mask in which a light-shielding film such as a chromium film and a resist film are stacked or laminated on a glass substrate.

A main deflector 130 and a sub deflector 132 each corresponding to an object deflector are disposed concentrically with the electronic lens barrel 102 between the sample 142 and the second shaping aperture 126. A position where the electron beam 112 is applied onto the sample 142 is determined by the main deflector 130 and the sub deflector 132.

Figure 2:
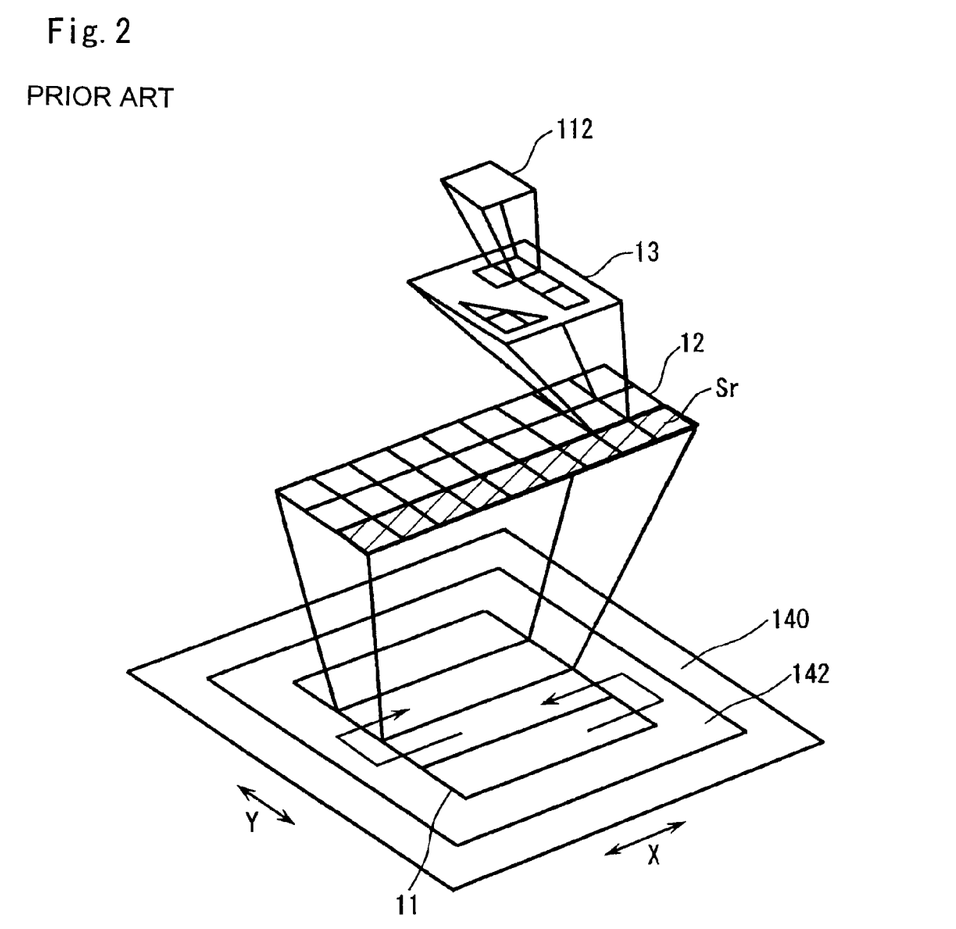
FIG. 2 is a conceptual diagram showing a writing process of sample 142.

When a writing process is executed at the electron beam writing apparatus, a pattern 11 to be written onto the sample 142 is divided into strip-like frame areas 12 as shown in FIG. 2. The respective frame areas 12 are written while the XY stage 140 is being continuously moved in the X direction and/or Y direction. Each frame area 12 is further divided into a plurality of subfield areas 13. The electron beam 112 shaped by the first and second shaping apertures 120 and 126 is deflected to write only a required part lying within the subfield area 13. Incidentally, the writing process is performed for every strip-like stripe area (shown with being hatched in FIG. 2) Sr different from the frame area 12.

A two-stage object deflector comprised of the main deflector 130 and sub deflector 132 is used for deflection of the electron beam 112. The positioning of the subfield area 13 is performed by the main deflector 130, whereas the location of a pattern writing position within the subfield area 13 is performed by the sub deflector 132.

The electron beam writing apparatus shown in FIG. 1 is equipped with a control section 200. The control section 200 is provided with a control computer 202 that performs various controls on the electron beam writing apparatus.

The control computer 202 is connected with a storage device 204, which stores design data (CAD data) therein. The design data are data obtained by converting chip data into formats capable of being inputted to the electron beam writing apparatus by an unillustrated external device.

A write data converter 206 converts the design data read from the storage device 204 to write data of a format inside the electron beam writing apparatus. The shape and position of each graphic pattern are defined in the write data.

Incidentally, the format conversion of the design data to the write data may be performed by the external device.

The post-format conversion write data is inputted to a pre-processor 208. The pre-processor 208 performs pre-processing such as a format check for the write data, an estimation of the number of shots, etc.

The write data subjected to the pre-processing is inputted to a shot data generator 210. The shot data generator 210 has shot dividing means 212 for dividing graphic data defined in the write data into graphics expressed in shot units, and distributing means 214 for distributing the respective graphics divided by the shot dividing means 212 to their corresponding subfield areas while performing a process for developing position information described in the write data.

The shot dividing means 212 temporarily stores the graphics divided in the shot units into a memory 216. The distributing means 214 reads each of the graphics stored in the memory 216 and distributes the read graphic to the subfield area.

Shot data generated by the shot data generator 210 is inputted to a deflection controller 218. The deflection controller 218 generates shaping deflection data for control of the shaping deflector 124, main deflection data for control of the main deflector 130 and sub deflection data for control of the sub deflector 132 from the shot data.

These shaping deflection data, main deflection data and sub deflection data are indication voltage signals of respective electrodes that configure the shaping deflector 124, main deflector 130 and sub deflector 132.

The shaping deflection data generated at the deflection controller 218 is transmitted to a shaping deflection amplifier 220, the main deflection data is transmitted to a main deflection amplifier 222, and the sub deflection data is transmitted to a sub deflection amplifier 224, respectively.

The shaping deflection data, the main deflection data and the sub deflection data are respectively DA-converted by the shaping deflection amplifier 220, the main deflection amplifier 222 and the sub deflection amplifier 224. The DA-converted signals are respectively amplified to be capable of driving the respective electrodes and then applied to the shaping deflector 124, the main deflector 130 and the sub deflector 132. Thus, the writing process is executed.

A shot data generating method corresponding to a characterizing portion of the present invention will next be explained with reference to FIGS. 3 through 7.

Figure 3:
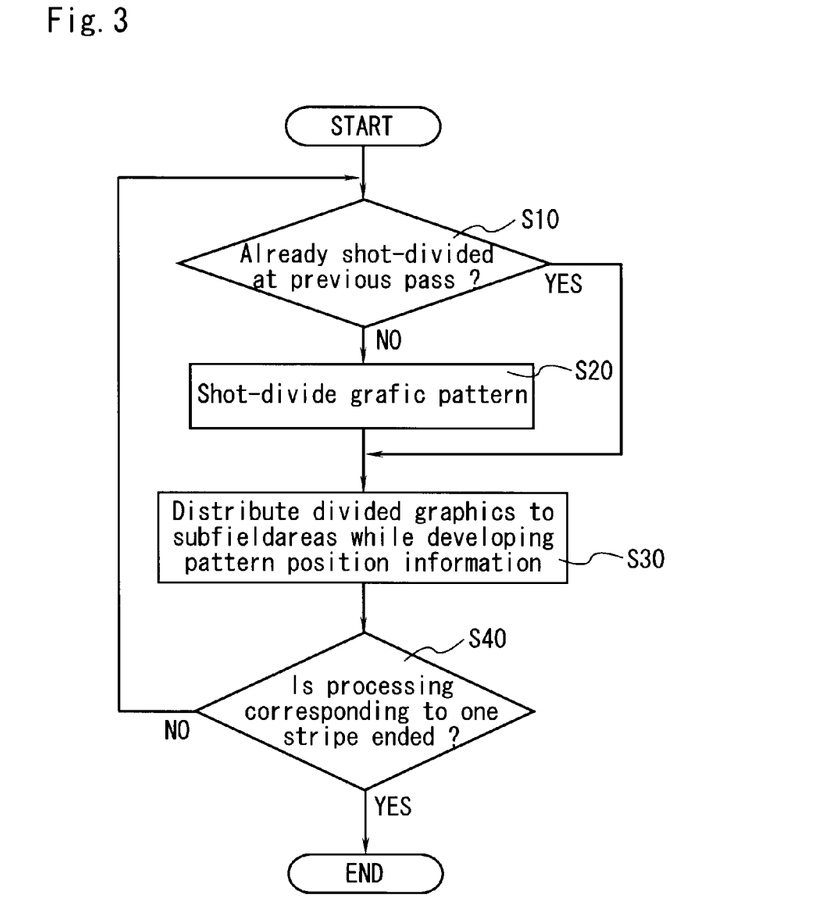
FIG. 3 is a flowchart showing a routine for generating shot data according to an embodiment of the present invention.
Figure 4:
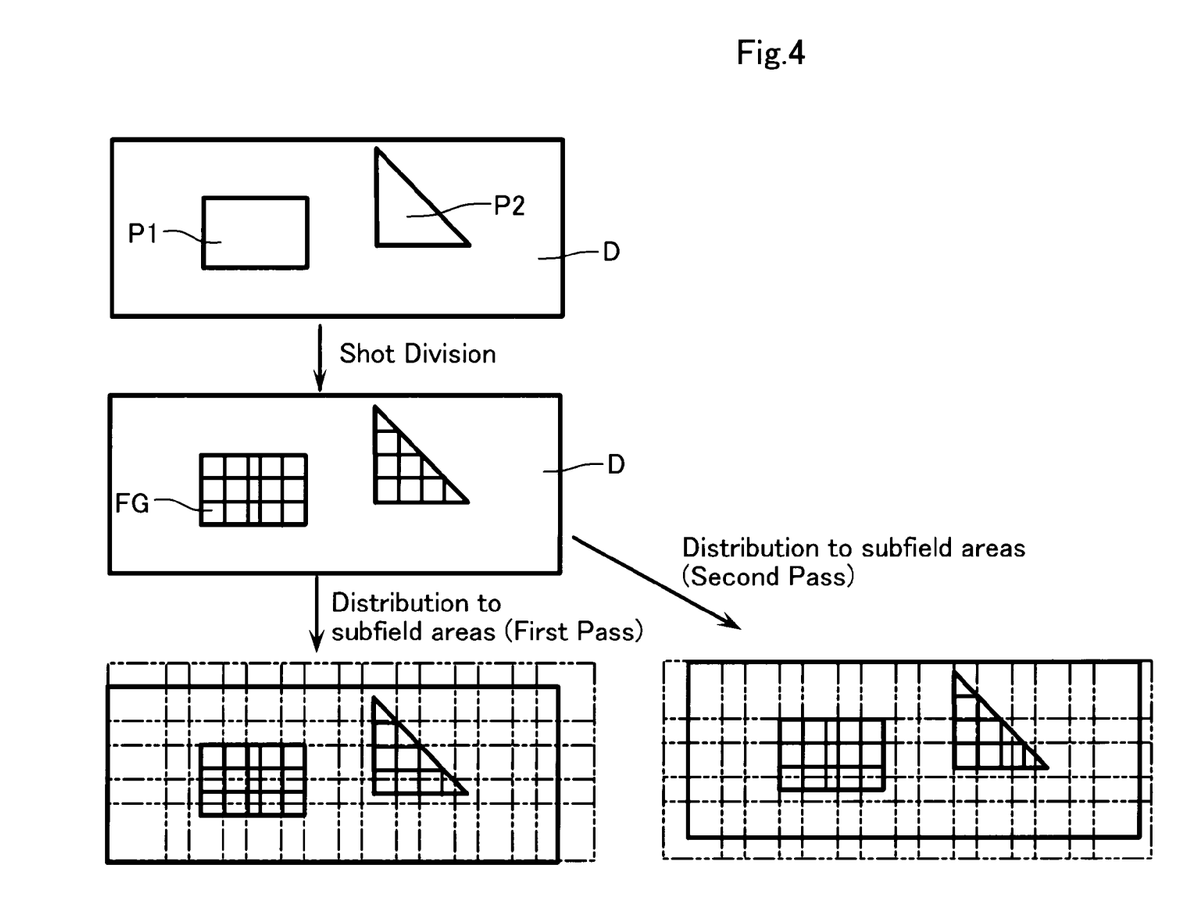
FIG. 4 is a conceptual diagram showing a routine for generating shot data according to an embodiment of the present invention.

FIG. 3 is a flowchart showing a routine for generating shot data. When a shot data generation command is inputted from the control computer 202, the routine is started up by the shot data generator 210.

According to the routine, it is discriminated whether a graphic pattern defined in an inputted write pattern has already been shot-divided at a previous pass (Step S10). It is discriminated at Step S10 whether the inputted graphic pattern is identical to the graphic pattern shot-divided at the previous pass.

When it is determined at Step S10 referred to above that the graphic pattern has already been shot-divided at the previous pass (first pass), the routine proceeds to a process of Step S30 without executing a process of Step S20. Thus, the post-shot division graphics corresponding to the first pass stored in the memory 216 are used for processing of the following Step S30 subsequent to a second pass.

On the other hand, when it is discriminated at Step S10 that the inputted graphic pattern is different from the graphic pattern shot-divided at the previous pass, i.e., when this time corresponds to shot division of a graphic pattern corresponding to the first time (first pass), the routine proceeds to the process of Step S20.

At Step S20, the graphic pattern defined in the write data is divided into a plurality of graphics expressed in shot units. The divided graphics are stored in the memory 216. In an example shown in FIG. 4, a rectangular graphic pattern P1 is shot-divided into fifteen graphics FG (=5×3), and a triangular graphic pattern P2 is shot-divided into ten graphics FG.

Since the shot division is performed before subfield area division on the basis of each graphic pattern defined in the write data unlike the conventional method, the shot dividing method can be simplified. That is, if the graphic pattern of the same shape is taken, the division of graphics is done by a unique method.

Next, the respective graphics shot-divided at Step S20 referred to above are read from the memory 216 while a process for developing position information defined in a state of being compressed to write data is being performed, and then distributed to their corresponding subfield areas (Step S30).

Since the graphic patterns per pass are identical where each pattern is drawn in multi-pass writing, the respective graphics shot-divided at the first pass can be used after the second pass. In an example shown in FIG. 7, distributions of graphics to subfield areas are rendered different from each other at first and second passes. When the pattern is written in the multi-pass writing in this way, the respective graphics stored in the memory 216 at the first pass can be used in the process of Step S30 executed after the second pass. Thus, the process of Step S20 becomes unnecessary after the second pass, the time necessary to generate the shot data is shortened and writing throughput can hence be improved.

On the other hand, when one graphic subjected to shot division extends astride a plurality of subfield areas adjacent to one another, it goes out of a deflector's control region, thus resulting in the degradation of writing accuracy. It is thus necessary to assuredly contain or hold the shot-divided graphics into one subfield.

Figure 5A:
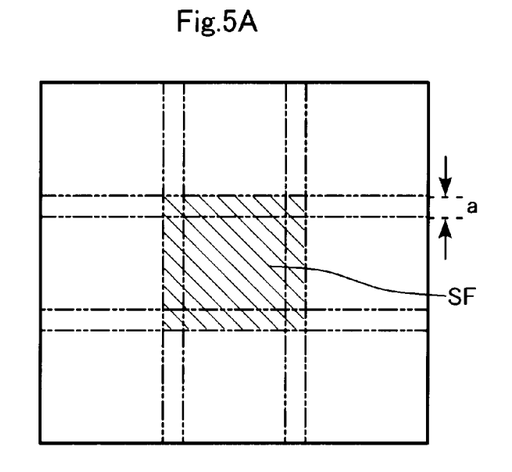
FIG. 5A to 5C is conceptual diagram explaining of a method of distributing of shot-divided graphic to subfield area.

Thus, in the present embodiment, subfield areas adjacent to one another are overlaid on one another by widths each greater than or equal to the maximum shot size as shown in FIG. 5A. An area hatched in FIG. 5A corresponds to one subfield area SF located in the center. The subfield area SF is superimposed on its adjacent each subfield area SF by the width of the maximum shot size a. The subfield areas SF are overlaid on each other in this way, so that the shot-divided graphics are always held within any one of the subfield areas.

Incidentally, the width at which the subfield areas overlap each other is suitable for being set to the maximum shot size a in terms of the efficiency of the writing process.

Figure 5B:
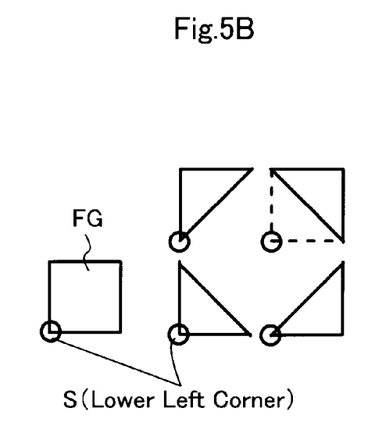
Figure 5C:
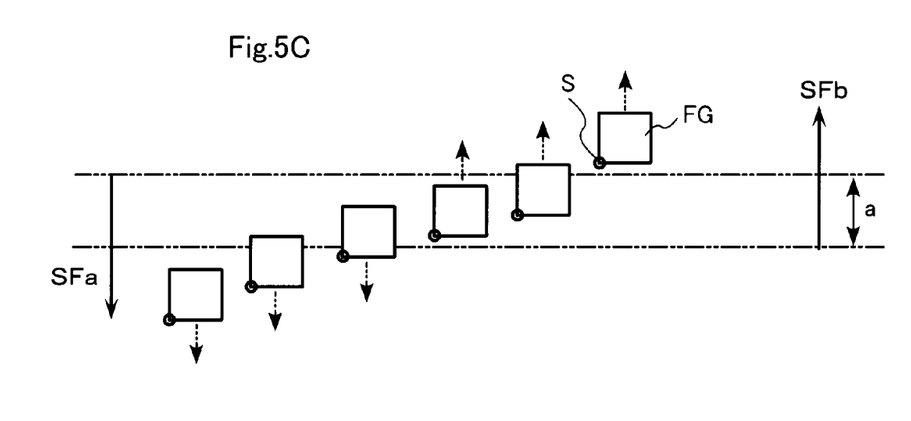

In the example shown in FIG. 5, when part of a graphic FG is located in an overlapped portion of each subfield area SF, the lower left corner of the graphic FG is taken as a standard part S as shown in FIG. 5B, and the corresponding graphic FG is distributed to either a subfield area SFa or SFb in which the standard part S is located, as shown in FIG. 5C.

Incidentally, the standard part S at the distribution of each graphic FG to the corresponding subfield area SF may be set to the corner other than the lower left corner.

Figure 6A:
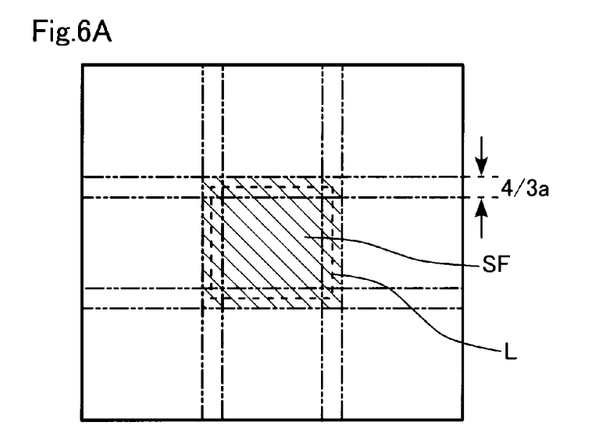
FIGS. 6A and 6B are conceptual diagrams explaining of a method of distributing of shot-divided graphic to subfield area.
Figure 6B:
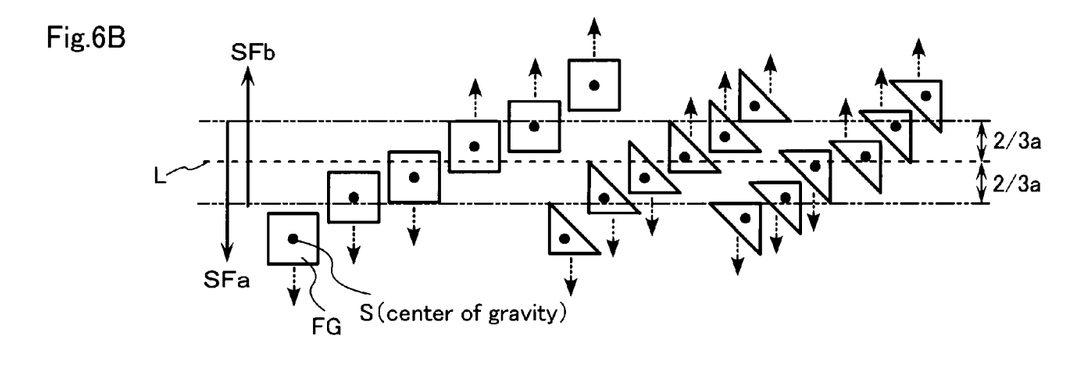
Figure 7:
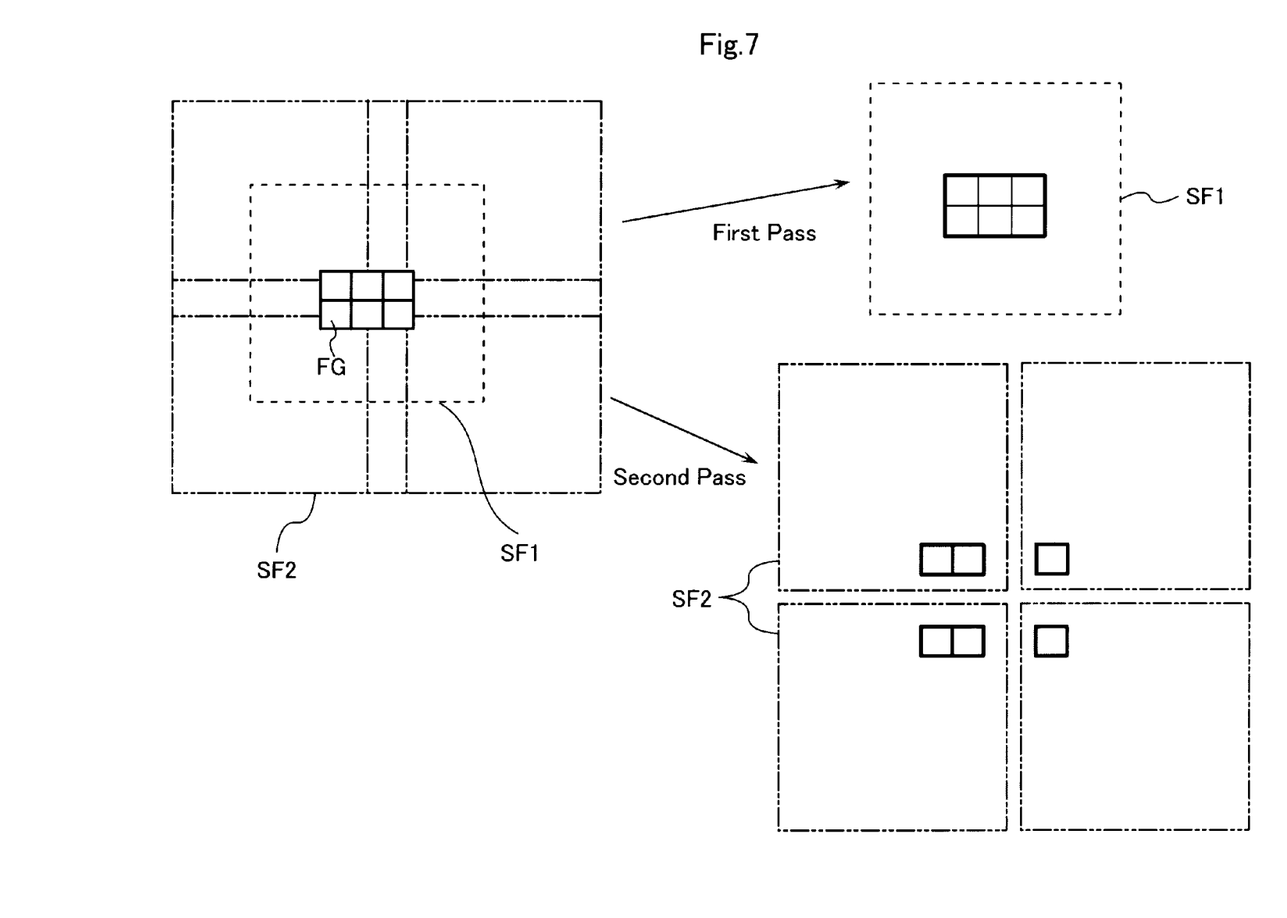
FIG. 7 is a conceptual diagram of distributing of graphic to subfield area in multi-pass writing.

With the center of gravity of each of the shot-divided graphics FG being taken as a standard part S as shown in FIG. 6, the graphics may be distributed to any one of subfield areas SF, based on the positions of the standard parts S. As shown in FIG. 6A, the overlay width of each subfield area SF is assumed to be a length equal to 4/3a times the maximum shot size a, and a line that separates its overlaid region into half is assumed to be a shot determination line L. As shown in FIG. 6B, graphics FG are distributed to either a subfield area SFa or SFb depending on whether the centers of gravity corresponding to standard parts S of the graphics FG are located on any subfield area side as viewed from the shot determination line L.

It is next discriminated whether processing corresponding to one stripe has been ended (Step S40). When it is determined at Step S40 that the processing corresponding to one stripe has not been completed, the routine returns to the process of Step S10.

On the other hand, the present routine is ended when the processing corresponding to one stripe is determined to have been ended. When distributing processing subsequent to a second pass exists in the next stripe area at this time, graphics shot-divided correspondingly are stored in the memory 216.

In the present embodiment as described above, the graphic data defined in the write data is divided into the plural graphics expressed in the shot units, and thereafter the divided graphics are distributed to their corresponding subfield areas, thereby generating the shot data. Accordingly, the shot dividing method can be simplified as compared with the conventional method that performs the subfield division before the shot division.

Figure 8A:
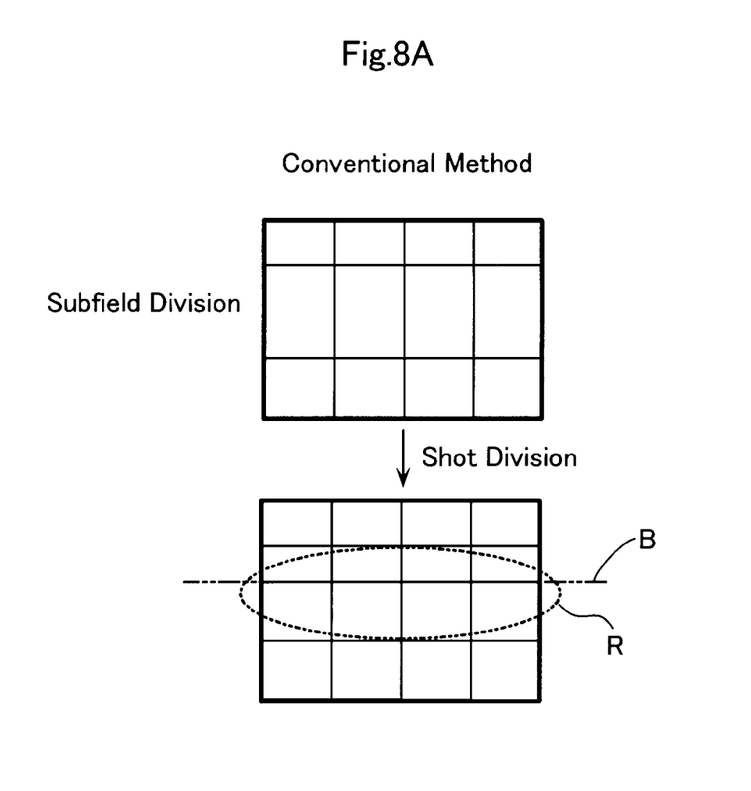
FIGS. 8A and 8B are conceptual diagram of explaining of effect on division of subfield.
Figure 8B:
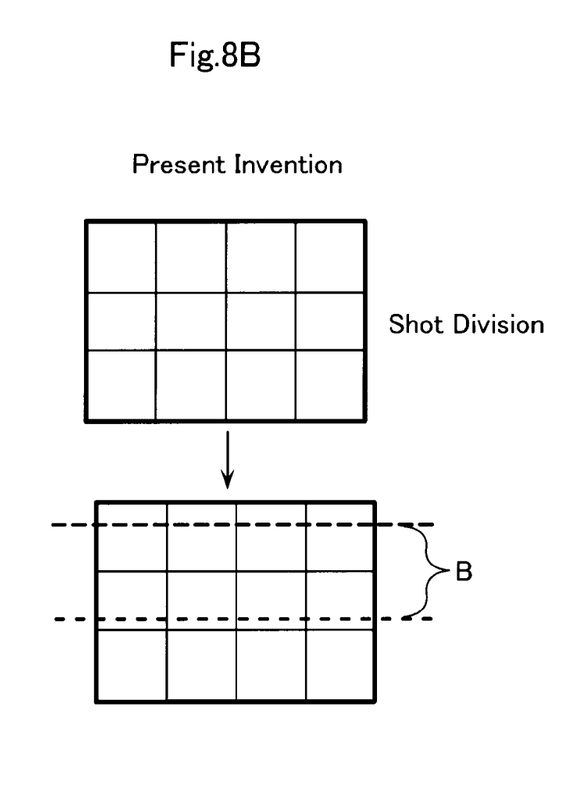

The conventional method that performs the subfield division before the shot division is accompanied by a problem in that when the boundary (referred to as "subfieldboundary" hereinafter) B between subfield areas exists as shown in FIG. 8A, the number of shots increases in a region R close to the subfield boundary B. On the other hand, according to the present embodiment, the number of shots is constant regardless of the presence or absence of subfield boundaries B as shown in FIG. 8B, and hence the number of shots can be prevented from increasing.

Further, since the shot dividing method simplified in this way can be adopted upon execution of an estimation of the number of shots for pre-processing, it is possible to enhance the accuracy of an estimation of the number of shots conducted at the pre-processor 208, by extension, the accuracy of an estimation of a writing time.

In the present embodiment, when the multi-pass writing is performed, the graphics shot-divided at the first pass are read from the memory 216 and used upon the distribution of the graphics to the subfield areas after the second pass, thereby making unnecessary the shot division subsequent to the second pass. Thus, since the time necessary for the shot division after the second pass can be reduced, the time taken to generate shot data can be shortened. It is thus possible to improve writing throughput.

Further, when the multi-pass writing is performed with each subfield area being shifted within the same stripe area, the graphics shot-divided upon the generation of the shot data at the first pass are used for immediately-executed distribution to the subfield area at the second pass, thereby making it possible to erase the graphics stored in the memory 216 in a short time. There can thus be obtained an advantageous effect that the capacity of the memory 216 for storing the shot-divided graphics therein can be reduced.

Figure 9:
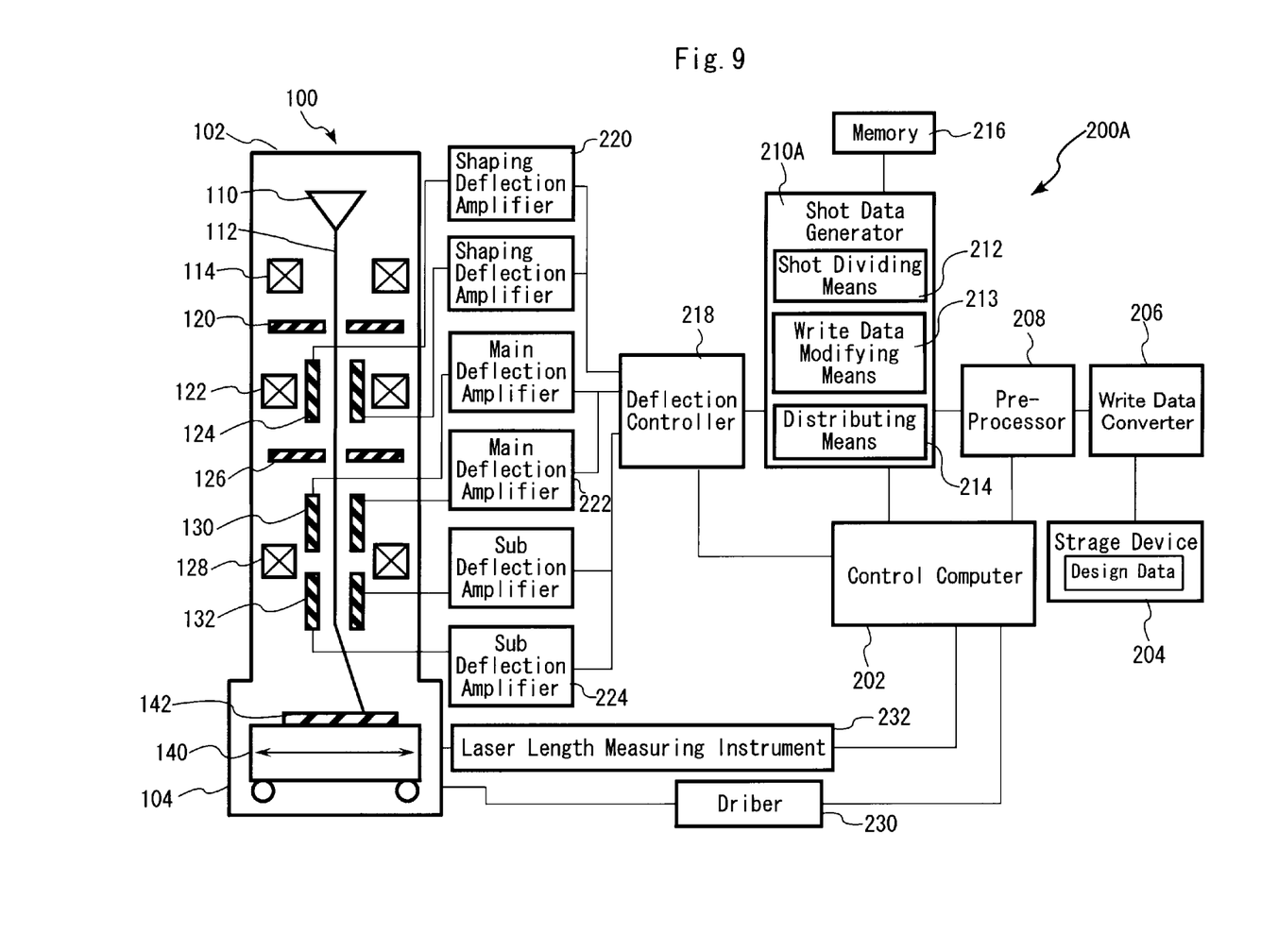
FIG. 9 is a conceptual diagram showing a configuration of an electron beam writing apparatus according to a second embodiment of the present invention.

A second embodiment of the present invention will next be explained. FIG. 9 is a conceptual diagram showing a configuration of an electron beam writing apparatus according to the second embodiment of the present invention. The electron beam writing apparatus shown in FIG. 9 is different from the electron beam writing apparatus shown in FIG. 1 in that a shot data generator 210A further includes write data modifying means 213 in addition to shot dividing means 212 and distributing means 214. Since the electron beam writing apparatus shown in FIG. 9 is similar in other configuration to the electron beam writing apparatus shown in FIG. 1, the detailed description thereof will be omitted.

The write data modifying means 213 performs a write data modifying process for causing the positions of respective graphics divided by the shot dividing means 212 to be moved on write data. The distributing means 214 distributes the respective graphics to their corresponding subfield areas, based on the positions of the graphics moved on the write data by the write data modifying means 213.

Figure 11:
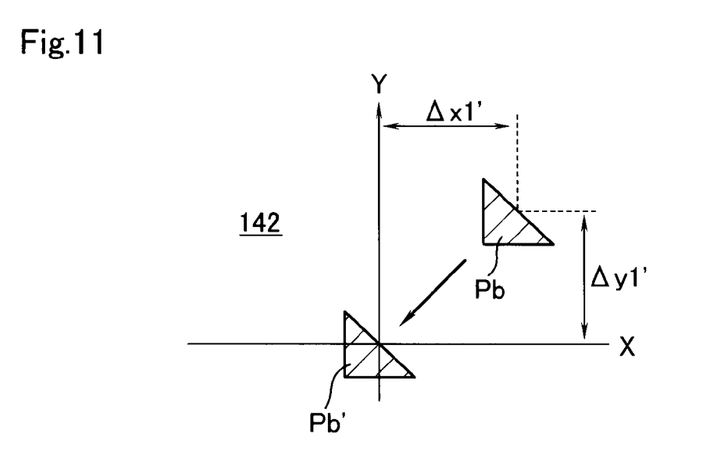
FIG. 11 is a diagram of explaining of a conventional offset process.
Figure 12A:
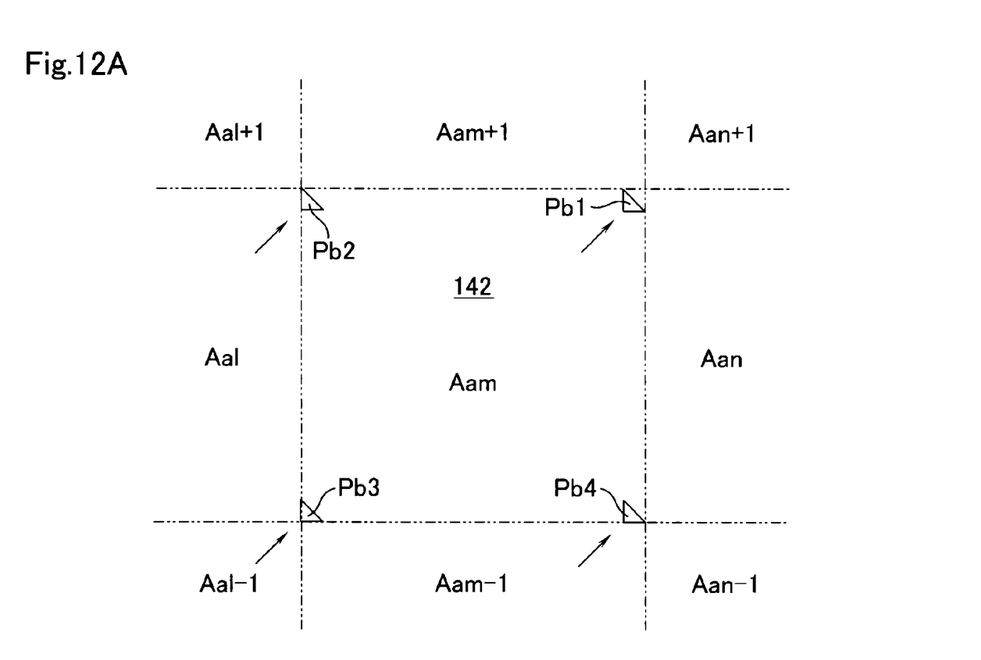
FIG. 12A and 12B are diagrams explaining a write data modifying process.
Figure 12B:
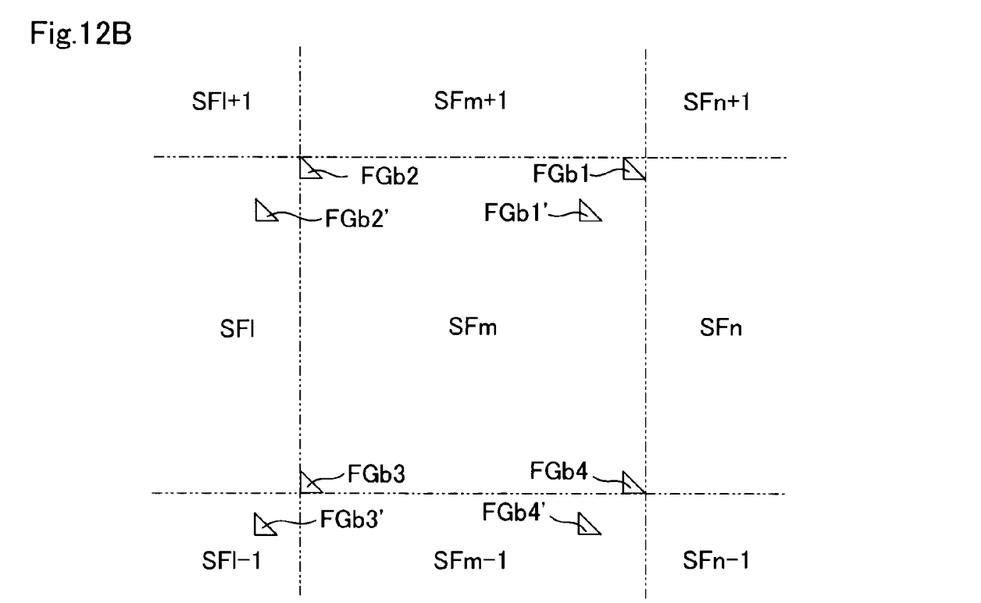

The write data modifying process executed by the write data modifying means 213 will be explained with reference to FIGS. 10 through 12.

A positional shift of an electron beam produced on a sample 142 of the electron beam writing apparatus will first be explained with reference to FIG. 10. In FIG. 10A, a position indicated by O is set as a reference point. In the example shown in FIG. 10, when an electron beam penetrated through a square opening of a first shaping aperture 120 is not deflected by a shaping deflector 124, it assumes an electron beam having an approximately square horizontal sectional shape and penetrates an opening 126a of a second shaping aperture 126. An approximately square pattern Pa is written in a predetermined position on the sample 142 shown in FIG. 10B by the electron beam 112a1 transmitted through the opening 126a.

Figure 10A:
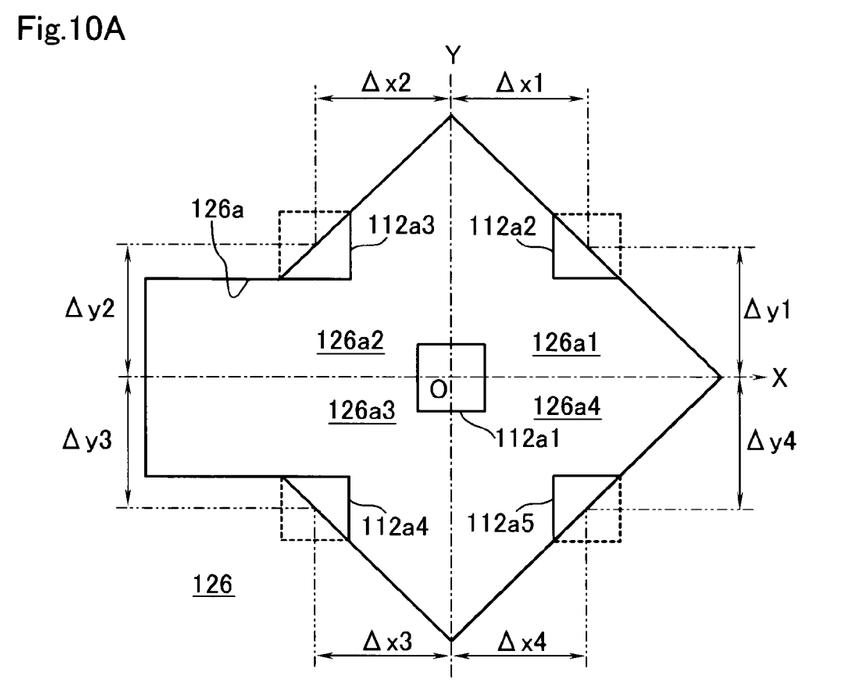
FIGS. 10A and 10B are diagrams of explaining of a positional shift of an electron beam produced on a sample 142.
Figure 10B:
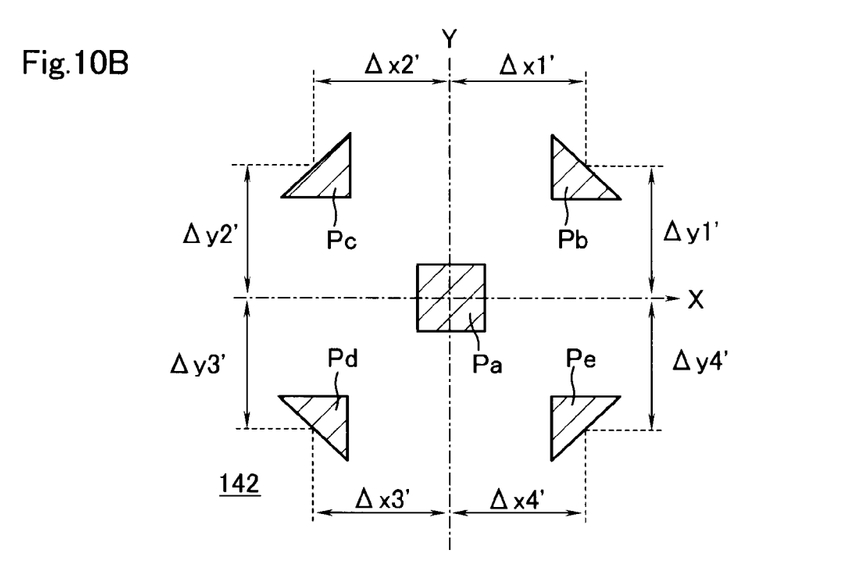

In the example shown in FIG. 10, when the electron beam penetrated through the opening of the first shaping aperture 120 is deflected by $\Delta x1$ to the plus side (right side in the figure) of an X axis and deflected by $\Delta y1$ to the plus side (upper side in the figure) of a Y axis by the shaping deflector 124, it assumes an electron beam having an approximately triangular horizontal sectional shape and penetrates an upper right portion 126a1 of the opening 126a of the second shaping aperture 126. Owing to the electron beam 112a2 penetrated through the upper right portion 126a1, an approximately triangular pattern Pb is written in a position shifted by $\Delta x1'$ from the position of the rectangular pattern Pa to the plus side of the X axis on the sample 142 and shifted by $\Delta y1'$ from the position thereof to the plus side of the Y axis on the sample 142.

Similarly, owing to an electron beam 112a3 penetrated through an upper left portion 126a2 of the opening 126a of the second shaping aperture 126, an approximately triangular pattern Pc is written in a position shifted by $\Delta x2'$ from the position of the rectangular pattern Pa to the minus side of the X axis on the sample 142 and shifted by $\Delta y2'$ from the position thereof to the plus side of the Y axis on the sample 142. Other patterns Pd and Pe are also written in their corresponding positions shifted from the position of the rectangular pattern Pa on the sample 142.

In order to cancel out the positional shifts $\Delta x1'$, $\Delta x2'$, ... in the X-axis direction and the positional shifts $\Delta y1'$, $\Delta y2'$, ... in the Y-axis direction, an offset process of a sub deflector 132 has conventionally been executed. In order to cancel out the positional shift $\Delta x1'$ in the X-axis direction, of the pattern Pb and the positional shift $\Delta y1'$ thereof in the Y-axis direction, both of which are shown in FIG. 10B by way of example, the electron beam is deflected to the minus side of the X-axis and the minus side of the Y axis by the sub deflector 132 as indicated by arrow in FIG. 11. Thus, as shown in FIG. 11, a pattern Pb' is written in a target position (i.e., a position where the positional shifts $\Delta x1'$ and $\Delta y1'$ are canceled out) on the sample 142.

Since, however, there is no other choice but to set the size of each subfield smaller than the size of a critical area or region (area in which the electron beam is deflectable at a maximum to the extent not to cause distortion or the like by the sub deflector 132) in such an offset process, writing throughput is in danger of being degraded.

Thus, in the present embodiment, a write data modifying process is performed without carrying out the conventional offset process. A description will be made of an example in which approximately triangular patterns Pb1, Pb2, Pb3 and Pb4 located at the four corners of a critical area Aam shown in FIG. 12A are written. Incidentally, arrows shown in FIG. 12A respectively indicate positional shifts of an electron beam caused by its penetration portion of the second shaping aperture. As described with reference to FIGS. 10A and 10B, the positional shift $\Delta x1'$ in the X-axis direction and the positional shift $\Delta y1'$ in the Y-axis direction occur in the pattern Pb written by the electron beam 112a1. The write data modifying process for canceling out the positional shifts of these patterns Pb1, Pb2, Pb3 and Pb4 is performed by the write data modifying means 213. That is, the respective graphics subjected to the shot division are moved to the minus side of the X axis by the amount corresponding to the positional shift $\Delta x1'$ in the X-axis direction and moved to the minus side of the Y axis by the amount corresponding to the positional shift $\Delta y1'$ in the Y-axis direction on the write data. As a result, for example, shot-divided graphics FGb1, FGb2, FGb3 and FGb4 are moved to their corresponding positions of graphics FGb1', FGb2', FGb3' and FGb4' on write data.

After the write data modifying process has been conducted as mentioned above, a plurality of graphics FGb1', FGb2', FGb3' and FGb4' contained in write data are respectively distributed to any of plural subfields by the distributing means 214. In an example illustrated in FIG. 12B, a graphic FGb1' is distributed to its corresponding subfield SFm, a graphic FGb2' is distributed to its corresponding subfield SF1, a graphic FGb3' is distributed to its corresponding subfield SF1-1, and a graphic FGb4' is distributed to its corresponding subfield SFm-1. In the present embodiment, the size of the subfield (SFm) can be made identical to the size of the critical area (Aam) as shown in FIG. 12. That is, it is not necessary to set the size of the subfield smaller than the size of the critical area. There can thus be obtained an advantageous effect that in addition to the advantageous effect obtained by the first embodiment, an improvement in throughput can be achieved as compared with the case where the conventional offset process is executed.

Incidentally, the present invention is not limited to the above embodiments, but may be implemented by making various modifications thereto within the scope not departing from the gist of the present invention. Although the electron beam has been used in the above embodiments, for example, the present invention is not limited to it. The present invention is applicable even to the case where other charged particle beams such as an ion beam, etc. are used.

Although in the present embodiment, the distribution of each graphic to the subfield area is performed after the shot division while the development process of each pattern position is being performed, the shot division may be carried out while performing the development process of each pattern position.

The features and advantages of the present invention may be summarized as follows.

In the first aspect of the present invention, each graphic pattern defined in write data is divided into a plurality of graphics expressed in shot units by shot dividing means. The divided graphics are distributed to their corresponding subfield areas by distributing means. According to the first aspect, since the graphic pattern of the write data is shot-divided without shot-dividing the graphics divided into the subfield areas, the shot division can be simplified. Thus, since the number of shots can be prevented from increasing and the time required to generate shot data can be shortened, writing throughput can be improved.

In the second aspect of the present invention, each graphic pattern of write data is divided into a plurality of graphics expressed in shot units. The divided graphics are distributed to their corresponding subfield areas. According to the second aspect, since the graphic pattern defined in the write data is shot-divided without shot-dividing the graphics divided into the subfield areas, shot division can be simplified. Thus, since the number of shots can be prevented from increasing and the time necessary to generate shot data can be shortened, writing throughput can be improved.

Thus, the shot division can be shared between a plurality of passes by applying the present invention to a case in which each pattern is written by multi-pass writing. Namely, since there is no need to perform the shot division by the number of passes and the shot division may be performed once, writing throughput can be enhanced.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-240340, filed on Sep. 19, 2008 including specification, claims, drawings and summary, on which the Convention priority of the present application is based, are incorporated herein by reference in its entirety.

What is claimed is:

1. A charged particle beam writing apparatus for deflecting a charged particle beam by a main deflector and a sub deflector to write a pattern sample, comprising:

a shot data generator for generating shot data from write data in which the shape and position of each graphic pattern are defined; and a deflection controller for generating deflection data for controlling the main deflector and the sub deflector from the shot data, wherein the shot data generator comprises shot dividing means for dividing the graphic pattern defined in the write data into graphics expressed in shot units, and means for distributing the respective graphics divided by the shot dividing means to subfield areas capable of being deflected by the main deflector, such that a number of shots over all subfield areas is constant regardless of a presence or absence of subfield boundaries, wherein a plurality of subfield areas are configured in such a manner that the subfield areas adjacent to one another overlap one another in widths greater than or equal to a maximum shot size, and wherein when part of each of the graphics divided by the shot dividing means is located in an overlapped portion of each of the subfield areas, the distributing means distributes the corresponding graphic to any one of the subfield areas, based on the position of a standard point of the graphic.

2. The charged particle beam writing apparatus according to claim 1, further comprising:

a first shaping aperture having an opening for allowing a charged particle beam irradiated from a charged particle gun to be penetrated therethrough; and a second shaping aperture having an opening for allowing the charged particle beam penetrated through the opening of the first shaping aperture to be penetrated therethrough, wherein the shot data generator further comprises write data modifying means for executing a write data modifying process for moving the position of each of the graphics divided by the shot dividing means on write data, based on which portion of the opening of the second shaping aperture is a graphic corresponding to each pattern written by the penetrated charged particle beam, and wherein the graphics whose positions have been moved on the write data by the write data modifying means, are distributed by the distributing means.

3. A charged particle beam writing method for writing each pattern onto a sample using a charged particle beam deflected by a main deflector and a sub deflector, comprising the steps of:

generating shot data from write data in which the shape and position of each graphic pattern are defined; and generating deflection data for controlling the main deflector and the sub deflector from the shot data, wherein the shot data generating step includes a shot dividing step for dividing the graphic pattern defined in the write data into a plurality of graphics expressed in shot units, and a distributing step for distributing the divided graphics to their corresponding subfield areas capable of being deflected by the main deflector, such that a number of shots over all subfield areas is constant regardless of a presence or absence of subfield boundaries, wherein a plurality of subfield areas are configured in such a manner that the subfield areas adjacent to one another overlap one another in widths greater than or equal to a maximum shot size, and wherein, in the distributing step, when part of each of the graphics divided at the dividing step is located in an overlapped portion of each of the subfield areas, the corresponding graphic is distributed to any one of the subfield areas, based on the position of a standard point of the graphic.

4. The charged particle beam writing method according to claim 3, wherein after the completion of the shot dividing step, the distributing step is executed while a process for developing positional information defined in the write data is being performed.

5. The charged particle beam writing method according to claim 3, wherein after the completion of the shot dividing step, the distributing step is executed while a process for developing positional information defined in the write data is being performed.

6. The charged particle beam writing method according to claim 3, wherein the charged particle beam is further penetrated through an opening of a second shaping aperture after having been penetrated through an opening of a first shaping aperture, wherein the shot data generating step further comprises a write data modifying step for executing a write data modifying process for moving the position of each of the graphics divided at the shot dividing step on write data, based on which portion of the opening of the second shaping aperture is a graphic corresponding to each pattern written by the penetrated charged particle beam and wherein the graphics whose positions have been moved on the write data in accordance with the write data modifying step, are distributed at the distributing step.

* * * * *